United States Patent
Lee

(10) Patent No.: US 7,192,869 B2
(45) Date of Patent: Mar. 20, 2007

(54) METHODS FOR PLANARIZING A METAL LAYER

(75) Inventor: Joo-Hyun Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/935,662

(22) Filed: Sep. 7, 2004

(65) Prior Publication Data
US 2005/0142829 A1    Jun. 30, 2005

(30) Foreign Application Priority Data
Dec. 30, 2003    (KR) ................. 10-2003-0100386

(51) Int. Cl.
*H01L 21/302* (2006.01)
(52) U.S. Cl. ................. 438/692; 257/E21.23
(58) Field of Classification Search ......... 438/689, 438/690, 691, 692; 257/E21.23, E21.304
See application file for complete search history.

(56) References Cited

U.S. PATENT DOCUMENTS

| 6,207,569 | B1 | 3/2001 | Schonauer et al. |
| 6,790,763 | B2 * | 9/2004 | Kondo et al. ............... 438/622 |
| 2005/0026549 | A1 * | 2/2005 | Maury et al. .................. 451/8 |

* cited by examiner

*Primary Examiner*—Scott B. Geyer
(74) *Attorney, Agent, or Firm*—Andrew D. Fortney

(57) ABSTRACT

Methods for planarizing a metal layer in a semiconductor device are disclosed. An illustrated example method comprises dividing a metal layer into a first section and a second section. A polishing removal rate associated with the first section is greater than a polishing removal rate associated with the second section. The method also includes forming an oxide layer on the first section of the metal layer; and planarizing the oxide layer and the metal layer using a chemical mechanical polishing process.

20 Claims, 2 Drawing Sheets

METHODS FOR PLANARIZING A METAL LAYER

FIELD OF THE DISCLOSURE

The present disclosure relates generally to semiconductor fabrication, and, more particularly, to methods for planarizing a metal layer in a semiconductor device.

BACKGROUND

As semiconductor devices have become increasingly highly integrated, research has been conducted into techniques for minimizing the line width(s) of conductors in wiring patterns. However, narrowing the line width of the conductors increases the wiring resistance and signal delay. In order to address this signal delay problem a multilayer wiring structure has been introduced for use in place of conventional single layer wiring structures.

Also, as the distance between the wiring decreases, parasitic capacitance between wiring on the same layer increases. As a result, the signal delay characteristic of the corresponding semiconductor device deteriorates. The increased signal delay caused by the increased parasitic capacitance has a particularly bad effect on the operating characteristics of a semiconductor device employing fine line width wiring.

In order to reduce the parasitic capacitance between the wiring, it is preferred to increase the thickness of the interlayer dielectric layer. Further, the wiring is typically formed out of a material having low resistivity such as copper (Cu) and the interlayer dielectric layer is often formed out of low permittivity material. However, the presence of copper is disadvantageous during dry etching due to the vapor pressure of the byproduct created during the etching process.

Recently, a Damascene process has been used to address this problem. The conventional dual damascene process is carried out as follows. A first interlayer dielectric layer, an etching stop layer, and a second interlayer dielectric layer are sequentially deposited on a substrate on which lower metal wiring is formed. A via hole is then formed by selectively patterning and etching the second interlayer dielectric layer, the etching stop layer, and the first interlayer dielectric layer. Next, the second interlayer dielectric layer is etched so as to form a trench having a width which is wider than that of an inlet of the via hole.

After the etching process, a barrier metal layer is formed inside the via hole. A metal layer such as a copper metal layer is then deposited on the barrier metal layer so as to fill the via hole and the trench. The copper metal layer is then planarized until the second interlayer dielectric layer is exposed. In this manner, a via interconnect is formed inside the via hole by the copper metal layer. Upper wiring is formed inside the trench by the copper metal layer.

In the above described conventional dual damascene process, a chemical mechanical polishing process is typically used to planarize the copper metal layer. In the chemical mechanical polishing process, the wafer is fixed in a polishing head and is rotated while facing downward toward a polishing pad such that the surface of the wafer is mechanically rubbed and, at the same time, chemically polished by a chemical slurry provided between the polishing pad and the surface of the wafer such that the specific material layer on the wafer is planarized.

However, chemical mechanical polishing can only planarize the wafer to a limited extent. In particular, the planarization achieved by the chemical mechanical polishing is limited by the characteristics of the chemical mechanical polishing equipment. For example, in the dual damascene process the center of the wafer is polished with a higher removal rate than the edge of the wafer or vice versa. As a result of this difference in the removal rates, the surface of the wafer cannot reliably be said to be uniformly planarized.

DETAILED DESCRIPTION

Figure 1:
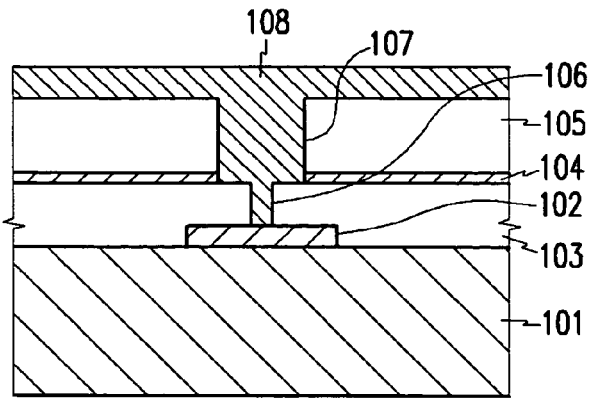
FIG. 1 is a schematic view of an example semiconductor device processed by a dual damascene process.
Figure 2:
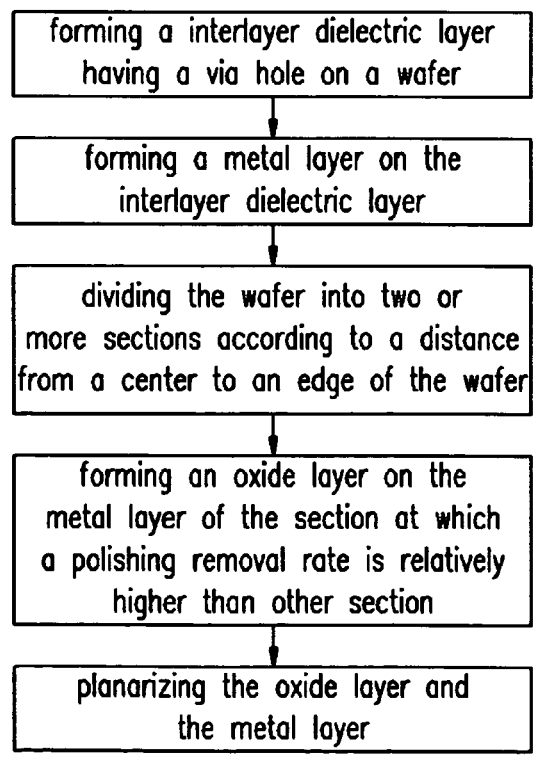
FIG. 2 is a flowchart illustrating an example metal layer planarization method performed in accordance with of the teachings of the present invention.

A preferred example metal layer planarization method performed in accordance with the teachings of the present invention will now be described with reference to the accompanying drawings. FIG. 1 is a schematic view of an example semiconductor device processed by a dual damascene process. FIG. 2 is a flowchart illustrating the example metal layer planarization method. The example metal layer planarization method of FIG. 2 is explained with reference to the example semiconductor device shown in FIG. 1.

As shown in FIG. 1, lower metal wiring 102, a first interlayer dielectric layer 103, an etching stop layer 104, and a second interlayer dielectric layer 105 are deposited in sequential order on a wafer. (The wafer typically includes other circuit components such as transistors (not shown)). A trench 107 and via hole 106 are formed in the second interlayer dielectric layer 105. A metal layer 108 (e.g., a copper metal layer) is deposited on the second interlayer dielectric layer 105 and in the trench 107 and the via hole 106.

After the copper metal layer 108 is deposited, an annealing process is applied to the copper metal layer 108. A chemical mechanical polishing process is then performed to planarize the copper metal layer 108. Preferably, oxygen gas is injected during the annealing process so as to form an oxide layer on the copper metal layer 108.

Figure 3A:
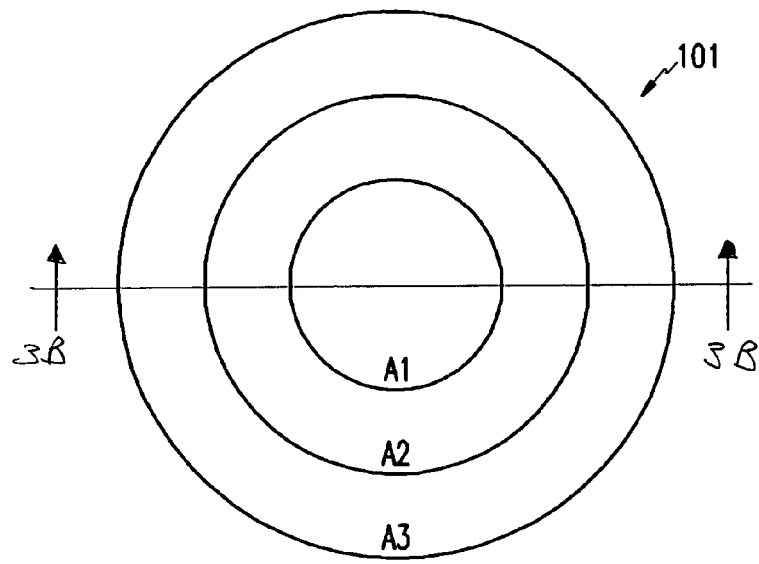
FIG. 3A is a plan view of an example wafer illustrating example oxide layers formed in first, second and third sections of the wafer.

The wafer 101 can be divided into, for example, two (2) or more concentric sections based on a distance from a center of the wafer 101 to an edge of the wafer. For example, as shown in FIG. 3A and FIG. 3B, the wafer 101 can be divided into three sections from the center to the edge of the wafer, namely, a first section A1, a second section A2, and a third section A3.

After dividing the wafer into sections, oxide layers 109A1 and 109A2 are formed on the copper metal layer 108 in different thicknesses. Assuming, in this example, that the polishing removal rate at the first section A1 (i.e., at the center of the wafer) is greater than the polishing removal rate at the third section A3, the oxide layer 109A1 is formed at a thickness in the range of 1200~1600 Å on the first section A1, the oxide layer 109A2 is formed at a thickness in the range of 200~600 Å on the second section A2, and no oxide layer is formed on the third section A3.

Even though not depicted, it is possible to form the oxide layer on the third section A3 at a thickness thinner than that of the oxide layer 103A2 on the second section A2. Also, if, for example, the polishing removal rate is greater in the third section A3 than in the first section A1, it is possible to form the oxide layer on the third section A3 at a thickness in the range of 1200~1600 Å and no oxide layer on the first section A1 (with, for example, an oxide layer of intermediate thickness (e.g., in the range of 200~600 Å) in the second section A2).

Figure 3B:
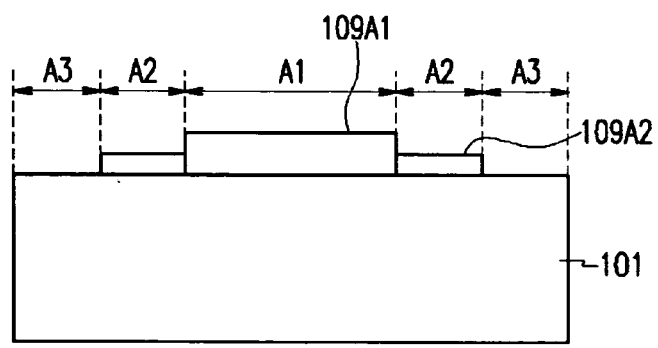
FIG. 3B is a cross sectional view of the example wafer taken along lines 3B—3B of FIG. 3A.

In the example of FIG. 3B, the thicknesses of the oxide layers increase stepwise from the outer edge toward the center of the wafer. However, the oxide layers can be formed such that the thicknesses of the oxide layers gradually increase or decrease (stepwise or linearly) from the center to the edge of the wafer 101.

The thicknesses of the oxide layers 109A1 and 109A2 formed on the first and second sections A1 and A2 are determined based on the polishing characteristic of the chemical mechanical polishing equipment, (i.e., the characteristic causing the wafer to be polished much more at the center portion than at the edge potion or vice versa).

When using the typical chemical mechanical polishing equipment, the polishing removal rate is higher at the center portion than at the edge portion of the wafer 101. Accordingly, in such circumstances, the oxide layer 109A1 of the first section A1 including the center of the wafer 101 is preferably formed thicker than the oxide layer 109A2 of the second section A2.

The oxidation process for forming the oxide layers 109A1 and 109A2 can be performed concurrently with a thermal treatment, (i.e., concurrently with an annealing process). The oxygen gas for the annealing process is injected through a plurality of nozzles arranged for the respective sections A1, A2, A3 of the wafer 101 so as to oxidize the copper metal layer 108. The oxide layer can be formed in different thicknesses at the different sections by adjusting the amount of the oxygen gas injected through the nozzles. For example, in the example of FIG. 3B, the oxygen gas is injected in large amount through the nozzle installed for the first section A1 and in relatively small amount through the nozzle installed for the second section A2 such that a relatively thick oxide layer 109A1 is formed on the copper metal layer 108 of the first section A1, a relatively thin oxide layer 109A2 is formed on the copper metal layer 108 of the second section A2, and no oxide layer is formed on the third section A3.

After the oxide layers 109A1, 109A2 are formed, the copper metal layer 108 is polished through the planarization process carried out by the chemical mechanical polishing equipment. Since the thickness of the oxide layer 109A1 on the first section A1 is thicker than the thickness of the oxide layer 109A2 on the second section, the entire surface of the wafer is planarized uniformly through the chemical mechanical polishing process. The polishing process proceeds until the second interlayer dielectric layer 105 is exposed. Additional conventional processes may then be carried out to complete fabrication of the semiconductor device.

During experimental measurements of the polishing time according to the thickness of the oxide layer, it took 61.4 seconds to polish a metal layer on which no oxide layer was deposited, 63.4 seconds to polish a metal layer on which an oxide layer was formed at a thickness of about 400 Å, and 65.3 seconds to polish a metal layer on which an oxide layer was formed at a thickness of about 1400 Å. With reference to these measurement results, the thicker the oxide layer, the longer the time taken to polish the metal layer. Accordingly, it is possible to prevent irregularities in the surface of the polished metal layer caused by differences in the polishing removal rates by forming oxide layers (e.g., layers 109A1 and 109A2) of different thicknesses on different sections of the wafer.

A problem to be considered is that resistance is increased by forming the oxide layer 109A1 and 109A2 on the metal layer 108. However, experiments by the inventor(s) have shown that the increase of resistance caused by forming the oxide layer at a thickness of about 1400 Å is tiny and can, thus, be tolerated. Accordingly, the increase in resistance caused by forming the oxide layer can be ignored.

From the foregoing, persons of ordinary skill in the art will appreciate that example methods of planarizing a metal layer have been provided which are capable of substantially uniformly planarizing an entire surface of the wafer. The illustrated example methods achieve this uniformity by forming an oxide layer on part(s) of the wafer where the removal rate(s) are relatively higher than the removal rate(s) associated with other parts of the wafer.

The metal layer planarization method illustrated in FIG. 2 is performed by forming an interlayer dielectric layer having a via hole on a wafer, forming a metal layer for filling the via hole by depositing conductive material on the interlayer dielectric layer, dividing the wafer into two or more sections based on a distance from a center to an edge of the wafer, forming an oxide layer on a section of the metal layer at which a polishing removal rate is relatively higher than another section, and planarizing the oxide layer and the metal layer using a chemical mechanical polishing process.

The oxide layer can be formed by dividing the wafer into two or more concentric sections and depositing the oxide layer at different thicknesses in these different sections.

In the example of FIGS. 3A and 3B, the oxide layers are formed by dividing the wafer into three concentric sections A1, A2 and A3, and depositing an oxide layer in the center section A1 of the wafer which is thicker than any other deposited oxide layer, because the chemical mechanical polishing equipment of that example has a greater polishing removal rate at the center portion A1 of the wafer than at the edge portion A3 of the wafer. In the illustrated example, no oxide layer is formed on the edge section A3, but it is possible to form a relatively thin oxide layer in that section A3.

Alternatively, if the polishing equipment has a greater removal rate at the edge of the wafer than at the center of the wafer, the oxide layer in the edge section A3 of the wafer is preferably made thicker than any oxide layer in any other section of the wafer.

As discussed above, the metal layer may be formed out of copper.

From the foregoing, persons of ordinary skill in the art will appreciate that the method illustrated herein solves the problem of non-uniform planarization of wafers created when the center portion A1 or the edge portion A3 of the wafer is removed much more quickly than other portions of the wafer due to the polishing characteristic of the chemical mechanical polishing equipment.

It is noted that this patent claims priority from Korean Patent Application Serial Number 10-2003-0100386, which was filed on Dec. 30, 2003, and is hereby incorporated by reference in its entirety.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for planarizing a metal layer comprising:
   forming the metal layer on a wafer having a first section and a second section, wherein a polishing removal rate associated with the first section is greater than a polishing removal rate associated with the second section;
   forming a first oxide layer on the first section of the metal layer, wherein a surface of the second section remains substantially free of oxide or has a second oxide layer thereon that is thinner than the first oxide layer; and
   chemical mechanical polishing the first oxide layer and the metal layer to remove the first oxide layer and planarize the metal layer.

2. A method as defined in claim 1, wherein the first section comprises a center area of the wafer.

3. A method as defined in claim 1, wherein the metal layer comprises a copper layer.

4. A method as defined in claim 1, wherein the first section comprises an outer edge of the wafer.

5. A method as defined in claim 4, wherein the metal layer comprises a copper layer.

6. A method as defined in claim 1, further comprising a third section between to first and second sections.

7. A method as defined in claim 6, further comprising forming a third layer onto third section.

8. A method as defined in claim 7, wherein the first oxide layer is thicker than the third oxide layer.

9. A method as defined in claim 8, wherein the metal layer comprises a copper layer.

10. A method as defined in claim 6, further comprising forming the second oxide layer on the second section.

11. A method as defined in claim 10, wherein the second oxide layer is thicker than any third oxide layer in the third section.

12. A method as defined in claim 11, wherein the metal layer comprises a copper layer.

13. A method as defined in claim 6, wherein the first, second and third sections are concentric.

14. A method as defined in claim 1 further comprising:
   forming an interlayer dielectric layer on a wafer; and
   forming the metal layer by depositing conductive material on the interlayer dielectric layer.

15. A method as defined in claim 14 further comprising forming a via hole in the interlayer dielectric layer.

16. A method as defined in claim 14, wherein the chemical mechanical polishing process results in the metal layer being coplanar with the interlayer dielectric layer.

17. A method for planarizing a metal layer comprising:
   forming an oxide layer on a first section of a metal layer without forming an oxide layer on a second a section of the metal layer, wherein a polishing removal rate associated with the first section is greater than a polishing removal rate associated with the second section; and
   removing the oxide layer and planarizing the metal layer using a chemical mechanical polishing process.

18. A method for planarizing a metal layer comprising:
   forming a first oxide layer on a first section of a metal layer;
   forming a second oxide layer on a second section of the metal layer, wherein the first oxide layer is thicker than the second oxide layer, and a polishing removal rate associated with the first section is greater than a polishing removal rate associated with the second section; and
   removing to first and second oxide layers and planarizing the metal layer using a chemical mechanical polishing process.

19. A method as defined in claim 18, wherein the first oxide layer has a thickness of 1200~1600 Å.

20. A method as defined in claim 18, wherein the second oxide layer has a thickness of 200~600 Å.

* * * * *